United States Patent
Kulkarni et al.

(10) Patent No.: US 10,002,654 B2
(45) Date of Patent: Jun. 19, 2018

(54) CAPACITIVE WORDLINE BOOSTING

(71) Applicant: Intel Corporation, Santa Clara, CA (US)

(72) Inventors: Jaydeep P Kulkarni, Hillsboro, OR (US); Pramod Kolar, Hillsboro, OR (US); Ankit Sharma, Hillsboro, OR (US); Subho Chatterjee, Hillsboro, OR (US); Karthik Subramanian, Austin, TX (US); Farhana Sheikh, Hillsboro, OR (US); Wei-Hsiang Ma, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 14/752,464

(22) Filed: Jun. 26, 2015

(65) Prior Publication Data

US 2016/0379694 A1    Dec. 29, 2016

(51) Int. Cl.
| | |
|---|---|
| *G11C 8/08* | (2006.01) |
| *G11C 7/18* | (2006.01) |
| *G11C 11/413* | (2006.01) |
| *G11C 11/418* | (2006.01) |
| *G11C 11/419* | (2006.01) |
| *G11C 5/14* | (2006.01) |

(52) U.S. Cl.
CPC ............ *G11C 8/08* (2013.01); *G11C 7/18* (2013.01); *G11C 11/413* (2013.01); *G11C 11/418* (2013.01); *G11C 11/419* (2013.01); *G11C 5/145* (2013.01)

(58) Field of Classification Search
CPC .................................. G11C 5/145; G11C 8/08
See application file for complete search history.

(56) References Cited

U.S. PATENT DOCUMENTS

| | | | | |
|---|---|---|---|---|
| 5,267,201 | A * | 11/1993 | Foss ..................... | G05F 3/205 365/149 |
| 5,297,104 | A * | 3/1994 | Nakashima ......... | G11C 11/4085 365/189.11 |
| 5,396,114 | A * | 3/1995 | Lee ..................... | G05F 3/205 323/313 |
| 5,895,487 | A * | 4/1999 | Boyd ................... | G06F 12/0817 711/122 |
| 6,208,196 | B1 | 3/2001 | St. Pierre | |
| 7,085,190 | B2 * | 8/2006 | Worley ............... | G11C 11/4085 365/189.11 |
| 7,092,305 | B2 * | 8/2006 | Watanabe ............. | G11C 8/12 365/222 |
| 7,948,300 | B2 * | 5/2011 | Ryoo ................... | H02M 3/07 327/536 |
| 8,040,174 | B2 | 10/2011 | Likhterov | |

(Continued)

OTHER PUBLICATIONS

Iijima et al. ("Low Power SRAM with Boost Driver Generating Pulsed Word Line Voltage for Sub-1V Operation" Journal of Computers, vol. 3, No. 5, May 2008 pp. 34-40.*

(Continued)

*Primary Examiner* — Huan Hoang
*Assistant Examiner* — Roberto Mancera
(74) *Attorney, Agent, or Firm* — Green, Howard & Mughal LLP

(57) ABSTRACT

In some embodiments, disclosed is a wordline boosting technique using a self-timed capacitive charge boosting approach.

17 Claims, 9 Drawing Sheets

(56) References Cited

U.S. PATENT DOCUMENTS

| | | | |
|---|---|---|---|
| 8,164,964 B2* | 4/2012 | Chandra | G11C 11/413 365/194 |
| 8,315,123 B2* | 11/2012 | Chong | G11C 11/418 365/189.11 |
| 8,817,553 B2* | 8/2014 | Yu | G11C 5/145 365/189.07 |
| 9,142,275 B2* | 9/2015 | Wang | G11C 8/08 |
| 2011/0128274 A1 | 6/2011 | Kumagai et al. | |
| 2013/0343143 A1 | 12/2013 | Jung | |
| 2015/0009751 A1 | 1/2015 | Kulkarni et al. | |

OTHER PUBLICATIONS

"Random Access Memory (RAM)." Techopedia.com. Techopedia, Dec. 11, 2011. Web. May 27, 2017. <https://web.archive.org/web/20111211062352/https://www.techopedia.com/definition/24491/random-access-memory-ram>.*

"MOSFET Small-Signal Model."www.prenhall.com. Prenhall, Aug. 19, 2003. Web. May 17, 2017. <https://web.archive.org/web/20030819094319/http://www.prenhall.com/howe3/microelectronics/pdf_folder/lectures/mwf/lecture12.fm5.pdf>.*

Sedra, Adel S., and Kenneth Carless. Smith. "13.4 CMOS Logic-Gate Circuits." Microelectronic Circuits. 6th ed. New York: Oxford UP, 2010. 1110-112. Print.*

International Search Report and Written Opinion for International Patent Application No. PCT/US2016/034437, dated Aug. 24, 2016.

International Preliminary Report on Patentability from PCT/US2016/034437 dated Jan. 4, 2018, 9 pgs.

* cited by examiner

US 10,002,654 B2

CAPACITIVE WORDLINE BOOSTING

TECHNICAL FIELD

This disclosure relates generally to electronic circuits and in particular, to wordline boosting techniques for memory structures.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
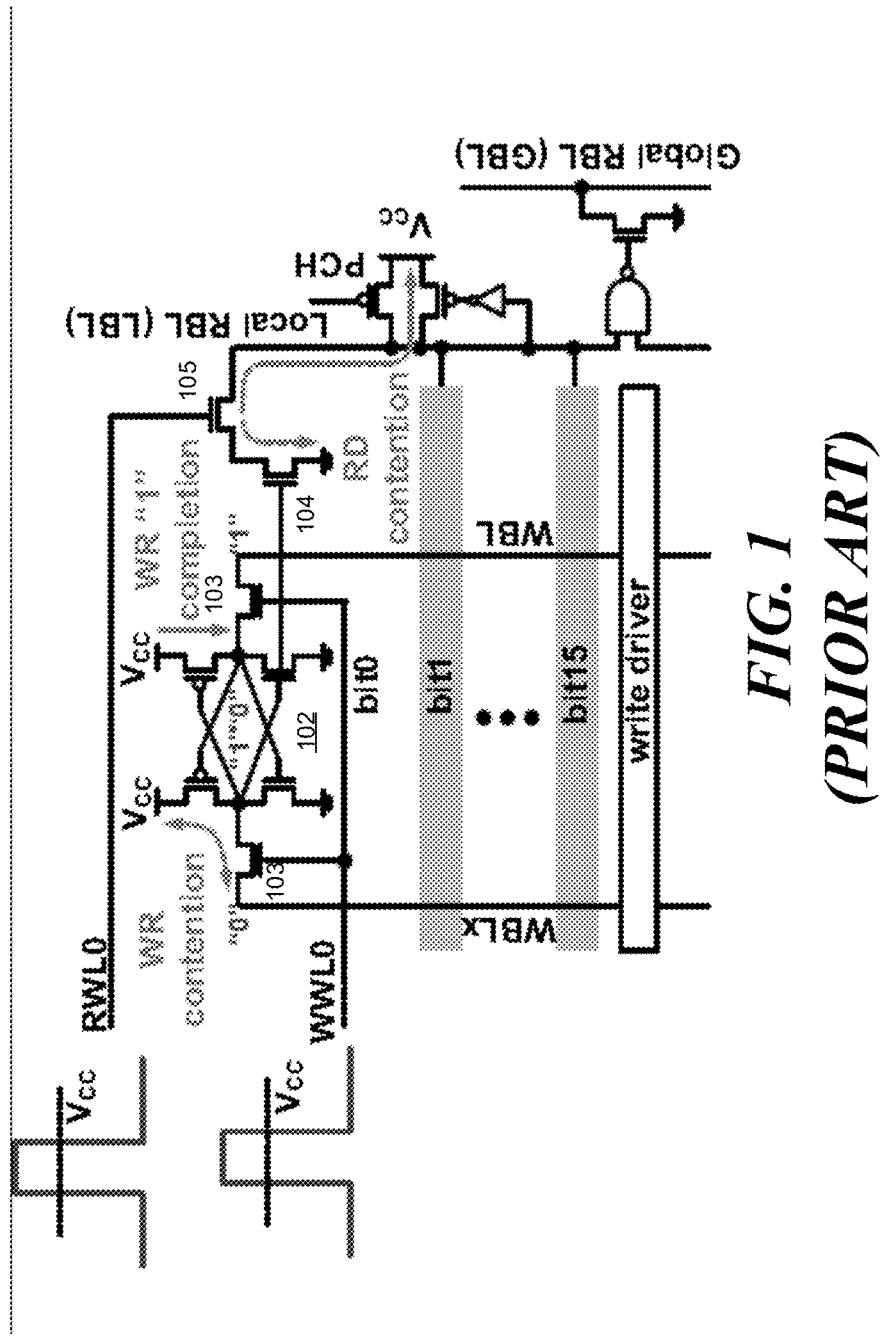
FIG. 1 shows a conventional 8T bit cell in a portion of a cache memory array.

With reference to FIG. 1, a conventional 8T bit cell in a portion of a cache memory array is shown. Such cells are commonly used, for example, in single supply cores for their performance critical, low-level cache and multi-ported register-file arrays.

In this depiction, each cell includes a cross-coupled inverter storage circuit 102, Pass gate access transistors 103, a read evaluation transistor 104, and a read access transistor 105. In order to lower processor energy consumption, It is generally desirable to lower the lowest possible supply voltage (Vcc) for which an array can reliably be operated. This minimal operating voltage is commonly referred to as "Vmin". Unfortunately, when a cell's supply level is lowered, commonly understood contention errors, both read and/or write contention, can occur, which can result in errantly read or written data.

One known approach to redressing these problems is known as wordline boosting. Wordline boosting, as the name implies, involves increasing the voltage on a wordline so as to turn on harder the access transistors for the cell(s) being written to or read from. Wordline Boosting is an effective technique for Vmin reduction of register file arrays. Boosting read-wordline (RWL) enables increased read "ON" current and mitigates the contention due to bitline keeper, which speeds up the local bitline (LBL) evaluation, thus improving read Vmin. Boosting a write wordline (WWL) can help write Vmin for several reasons. It can improve contention between a pass gate access transistor and its associated bit cell pull-up device. It also can improve completion by effectively writing a "1" due to higher G-S voltage across the pass gate access transistor.

Figure 2:
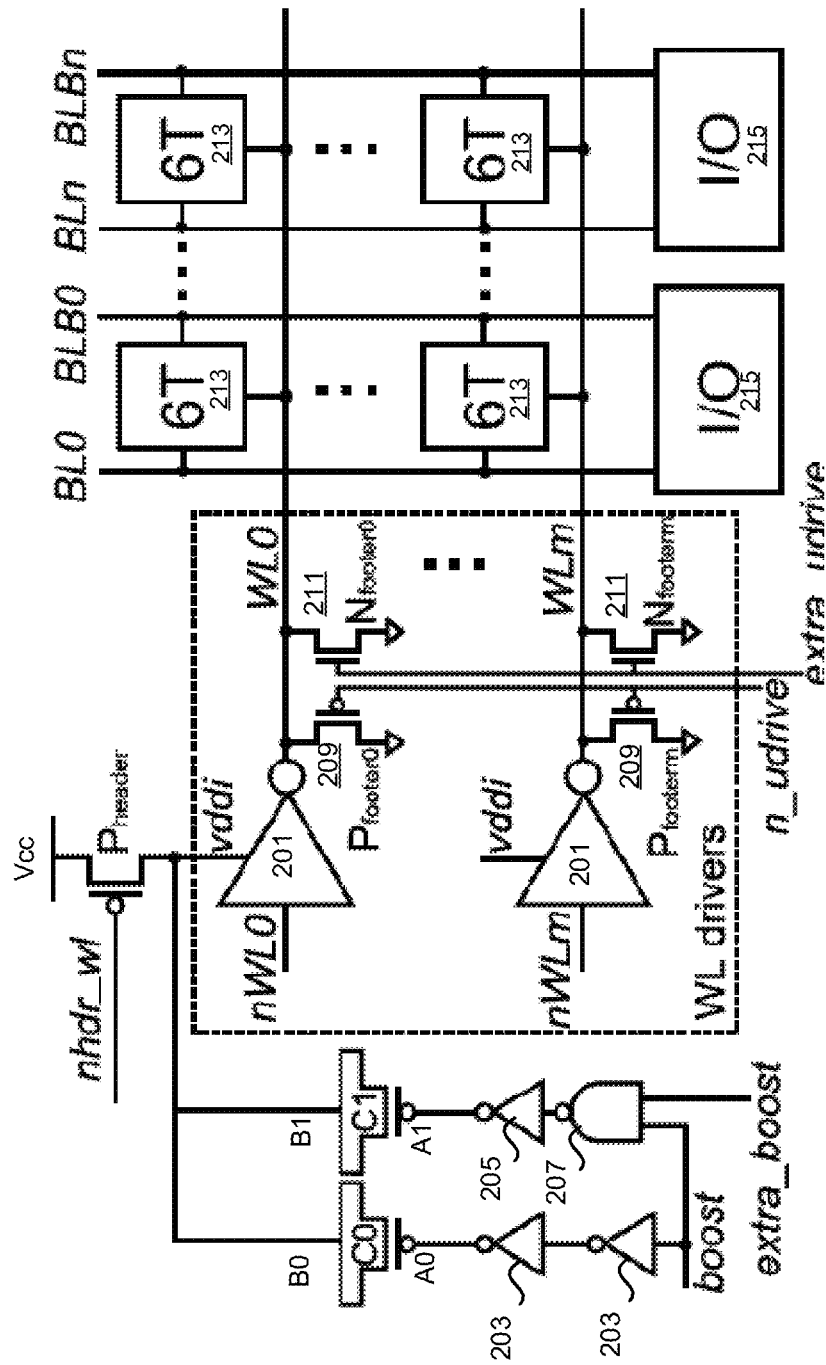
FIG. 2 illustrates a known wordline boosting scheme using flying capacitors to boost wordlines in a memory array.

FIG. 2 shows a known wordline boosting schemes using flying capacitors (C0, C1) for 6T SRAM cells 213. (Capacitors C0 and C1 are referred to as "flying" since they are not connected on either side to a fixed voltage.) An early-timer signal (e.g., a pre-decoder address decode) is used for triggering the capacitors by controlling boost, extra_boost, and nhdr_wl signals so as to cause charge from C0 or both C0 and C1 (if extra boost is desired) to boost vddi, which in turn, boosts WL when the driver is asserted. Upon the assertion of a wordline such as WL0, as an example, the boost and extra_boost signals are Low, and the header P device is On (nhdr_wl Low). This causes approximately Vcc to be charged across both capacitors. When the wordline is to assert, nWL0 goes Low, which causes WL0 to drive to vddi. While the driver is still asserted (nWL0 Low), the header device is turned off. At the same time, or shortly thereafter, boost and possibly also extra_boost (if additional WL boost is desired) are asserted (High). This causes vddi, which is now supplied from B0 and B1, to increase, on ratio of the flying capacitor and the capacitance of the wordline. In this way, the wordline is boosted above Vcc without the need, for example, of a separate supply, or charge pump, or a level shifter.

Unfortunately, this approach is susceptible to timing mismatch between the actual wordline decode path and the flying capacitor trigger paths. For example, if the header device ($P_{header}$) is turned off too early, the wordline may not be transitioned to full Vcc before flying capacitor trigger, resulting in a lower boosting ratio or potentially under driving the wordline. In another scenario, if the flying capacitor charge transfer is initiated before the header P device is turned OFF, the charge stored on the flying capacitors can be partially discharged into the Vcc supply, thereby also degrading the boosting ratio. Moreover, in a memory compiler, the wordline slew rate is dependent on the data I/O width (bits connected to a single WL) as well as the wordline repeater distance. Managing the flying-capacitor trigger timing across a wide wordline slew (due to WL load) and transition time (due to repeater) can be very challenging across PVT conditions and product skews, for example. Accordingly, new approaches may be desired.

Figure 3:
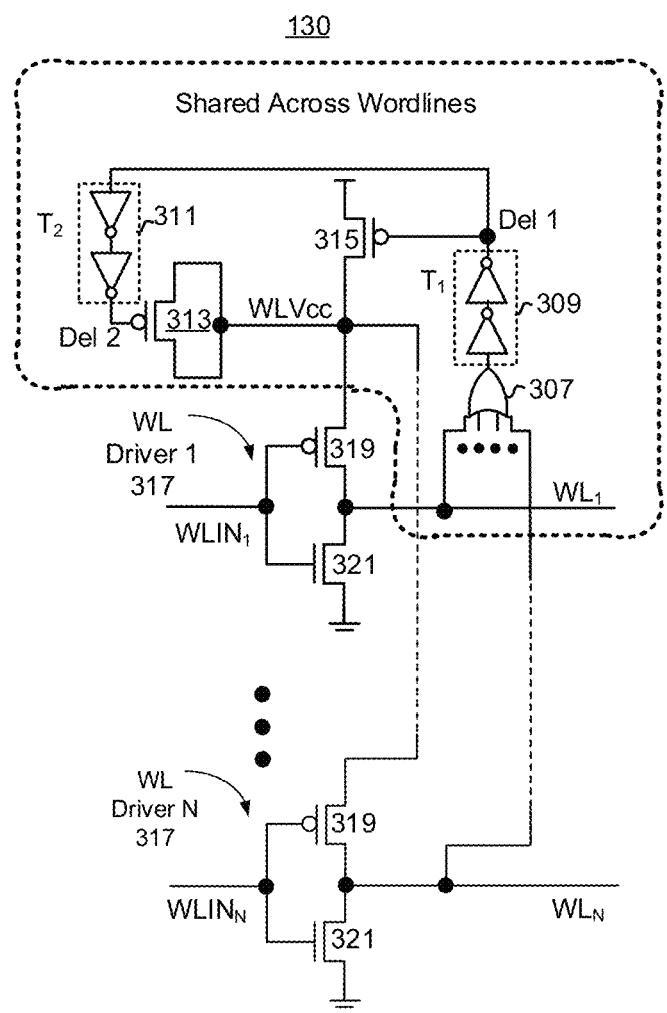
FIG. 3 shows a flying capacitor based wordline boosting circuit in accordance with some embodiments.

FIG. 3 shows a flying capacitor based wordline boosting circuit in accordance with some embodiments. Each wordline has an associated driver 317. In addition, there is a shared capacitive boost circuit including a logical OR circuit 307, a first delay element 309, supply header P device 315, a second delay element 311, and flying capacitor 313, coupled together as shown. (Note that flying capacitor 313 is formed from a CMOS transistor with its source and drain connected together. It should be appreciated, however, that any suitable capacitor implementation could be employed.)

Figure 4:
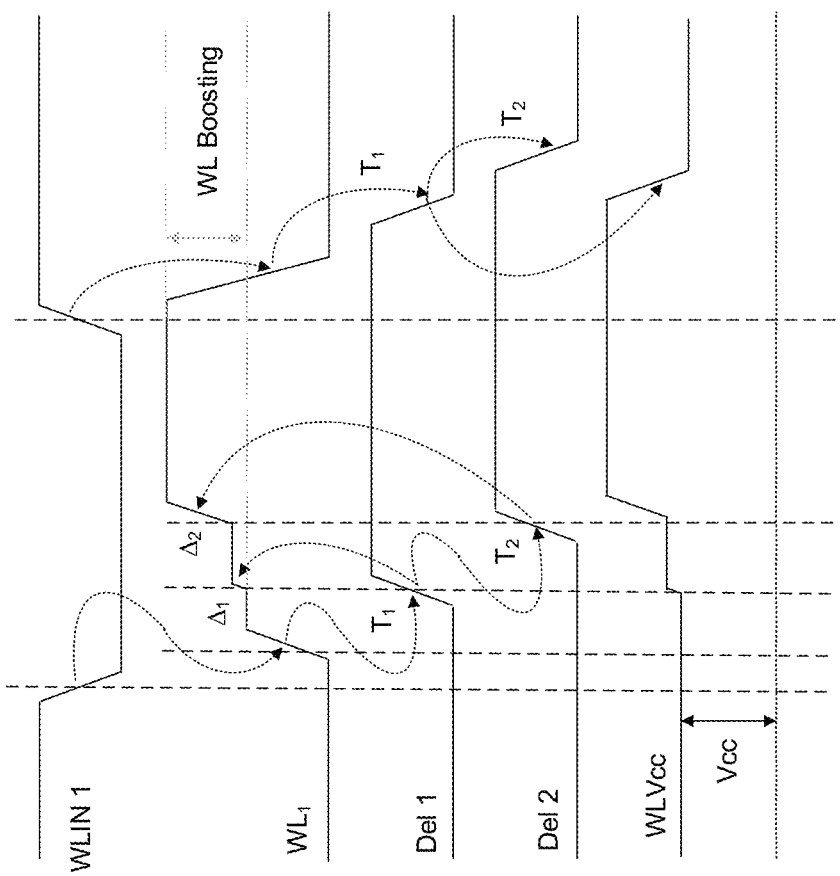
FIG. 4 is a timing diagram illustrating a wordline boosting operation for the circuit of FIG. 3.

FIG. 4 is a timing diagram illustrating a wordline assertion with boost for the circuit of FIG. 3. When a particular WL (say $WL_1$) is to assert, then $WLIN_1$ goes Low. At this time, the P header device 315 (which is one embodiment for a supply switch or supply device) is On, and the wordlines are at Vss. Upon assertion (Low) of $WLIN_1$, the wordline ($WL_1$) is charged to Vcc through P header 315 as the driver P device (319) is turned On. As $WL_1$ crosses the switching threshold (say 50% Vcc) of the OR gate 307, the first delay element 309 is triggered and the Del 1 node transitions High after a delay of T1, thereby turning Off the P header 315. (Note that turning "Off" a header (which is a driver supply device) refers to turning down the header device enough to sufficiently deactivate the driver so that charge can be capacitively coupled onto the wordline to boost the wordline voltage.) The delay (T1) of first delay 309 may be designed to allow $WL_1$ to reach from 50% of Vcc to full Vcc (local timing margin). This should ensure that $WL_1$ has reached full Vcc (or at least sufficiently close to it) before the wordline is floated with the header device 315 being turned Off. The rising transition on the Del 1 node is capacitively coupled to the WLVcc node through Cgd of header device 315, which creates a small, initial wordline boost Δ1.

(Note that timing for this circuit can be controlled in various different ways. For example, the delay elements themselves may be designed and/or programmed to attain desired delay periods. In addition, the delay chain initiation can be controlled, e.g., by controlling (through design or otherwise) the trip point of the OR logic inputs (e.g., they could be at ⅓, ½, or ⅔ Vcc). Alternatively, separate circuitry such as a Schmitt trigger could be employed. The timing should be controlled, for example, so that the wordline reaches sufficiently near Vcc before the header is turned off. Along these lines, when referring to pulling the wordline up to Vcc, it should be appreciated that this means pulling a wordline up to its desired, attainable voltage, which may approach Vcc very closely but not actually reach it, due, e.g., to parasitics, Vsd drops, etc.)

Next, Del 2 transitions high once the Del 1 transition propagates through the second delay element 311, which has a delay of T2. This delay is to make sure that the header device is sufficiently turned off before the capacitor 313 triggers. A rising transition on Del 2 raises the bottom node of the capacitor 313 towards Vcc, which raises the top node to approach 2 Vcc, thereby transferring charge stored on the capacitor into WLVcc and thus, $WL_1$ through driver P device 319 creating an additional, more substantial wordline boost (Δ2 in the timing diagram of FIG. 4).

The shared boost circuitry (header device, wide OR logic, first delay element, second delay element, and flying capacitor) are shared across multiple wordlines and wordline drivers. The actual number of wordlines and wordline drivers to share common boost circuitry will typically depend on various factors such as required boosting ratio, leakage of the unselected wordline drivers, flying capacitor space constraints, etc. Note that with this approach, the rising transitions used for boosting are triggered by a preceding stage, in the depicted embodiment, starting with the wordline asserting, which results in a self-timed wordline boosting technique, in contrast with earlier approaches that required separate timing and/or signaling.

Figure 5:
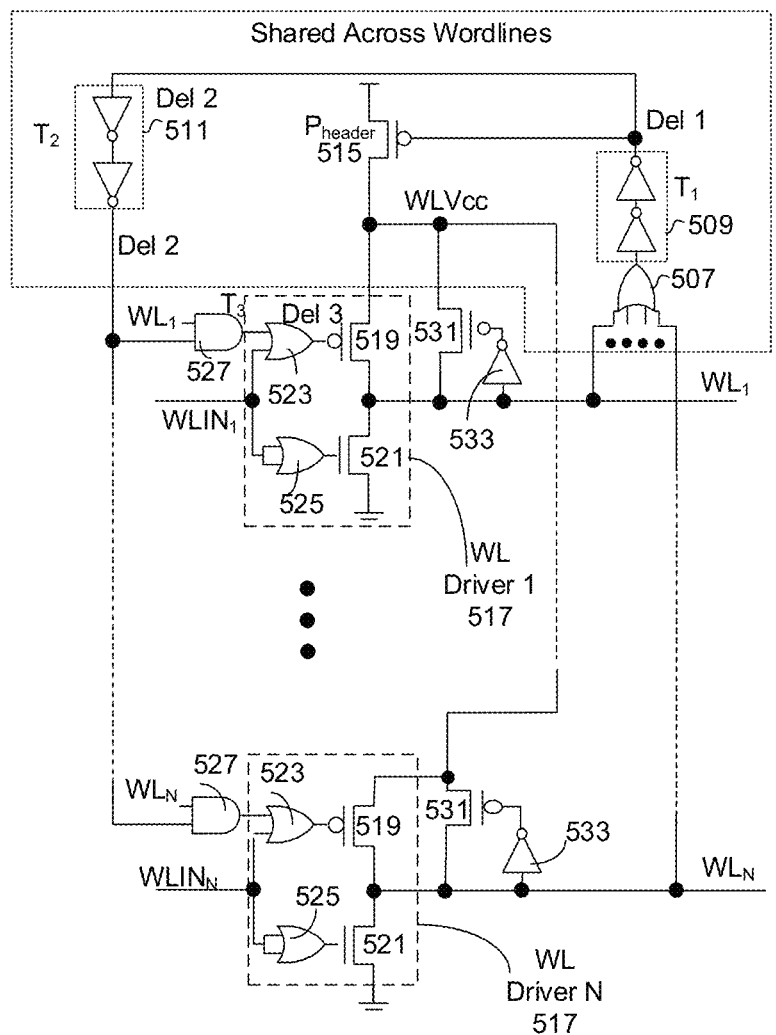
FIG. 5 shows another flying capacitor based wordline boosting circuit in accordance with some embodiments.

FIG. 5 shows another self-timed wordline boosting technique in accordance with some embodiments. Here, the WL driver P device capacitance is used as a flying capacitor without the need for a separate, dedicated, additional capacitor. In the depicted embodiment, shared charge boosting circuitry, as with the circuit of FIG. 3, includes OR logic (507), a first delay element (509), a second delay element (511), and a header device (515). In contrast with the circuit of FIG. 3, the shared circuitry does not include a separate capacitor to function as a flying capacitor for boosting the wordline. In addition to the shared charge boosting circuitry, each wordline also has an associated driver 517 and switch circuitry formed from a P device 531 and an inverter 533, as shown. Note that in this embodiment, a split input Wordline driver, rather than an inverter driver is used. It is referred to as "split" because the inputs of its pull-up, P-type transistor (519) and pull-down, N-type transistor (521) devices are independently controlled, e.g., in this embodiment, by OR gates, 523 and 525, respectively. The WL input signal ($WLIN_i$) is provided to one input of the top OR gate (523) and to both inputs of the lower OR gate 525. The other input of the top OR gate 523 is provided from AND gate 527. The inputs of AND gate 527 come from the wordline itself ($WL_i$) and the output (Del 2) of the second delay element 511.

Figure 6:
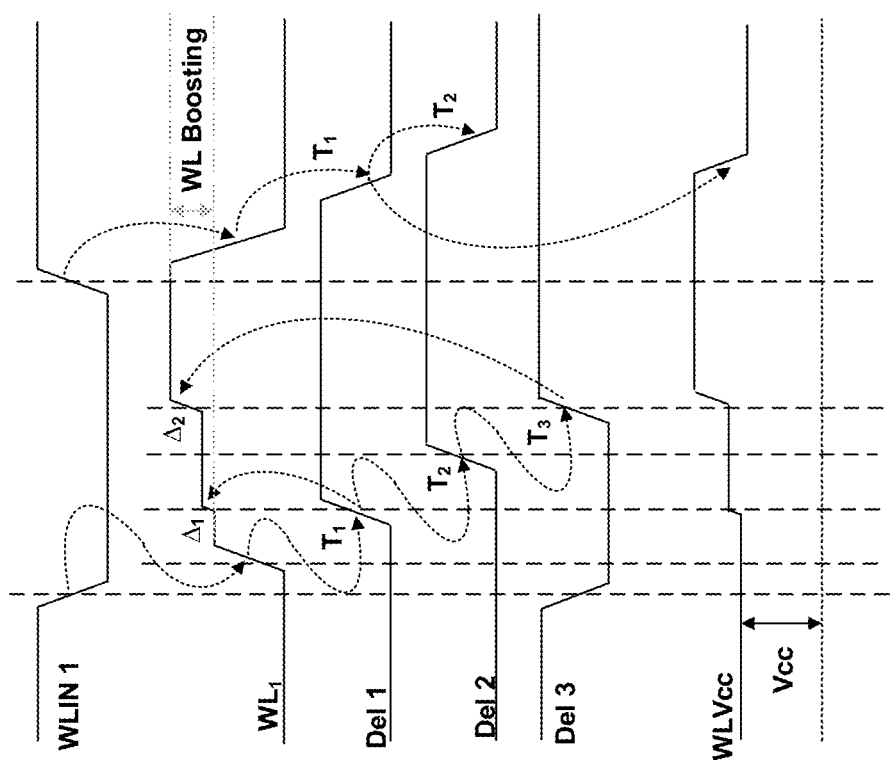
FIG. 6 is a timing diagram illustrating a wordline boosting operation for the circuit of FIG. 5.

FIG. 6 is a timing diagram showing a boost operation for wordline 1 ($WL_1$). The shared circuitry generally works as that from FIG. 3 for controlling the header device 515. The wordline (WL1) transitions to a High upon the assertion (Low) of $WLIN_1$. When $WL_1$ reaches a transition threshold for the OR logic 507, it starts a transition through the first delay element 509, which turns Off the header device after T1. The transition asserts at Del 2, an input of AND gate 527, after an additional T2 delay. The asserting wordline not only causes OR gate 507 to transition (which generates the transition through the first and second delay elements), but also, it causes inverter 533 to transition to a Low. This causes switching transistor 531 to turn on, which "shorts" the drain and source of driver P device 519 together, effectively turning transistor 519 into a CMOS capacitor. Once $WL_1$ is raised to Vcc, the pull-up path through the header 515 is disabled.

The rising transition at Del 2 propagates to the Del 3 node after a T3 delay and raises the gate terminal of driver P device 519 (which now acts as a flying capacitor with its source and drain connected together), which pushes charge stored on 519 into the WLVcc and $WL_1$ nodes (now coupled together through switch 531) creating the Δ2 wordline boost. Note that additional boosting (Δ1) comes from the Cgd component of P header 515 when Del 1 goes High.

So, with such an embodiment, a dedicated separate capacitor is not required to function as a flying capacitor. Wordline boosting is achieved by using the wordline driver P device (519) initially, in its normal role, as a pull-up device for the WL charging to Vcc and then as a flying capacitor to achieve wordline boosting. While this may avoid the need for a separate, dedicated capacitor, it may provide less boost capability than a circuit with a separate (e.g., larger) capacitor. So, whether or not to use a separate dedicated capacitor, an already available driver capacitor, or a combination of both (see FIG. 7 below) will depend, as always, on design requirements and trade-offs.

Figure 7:
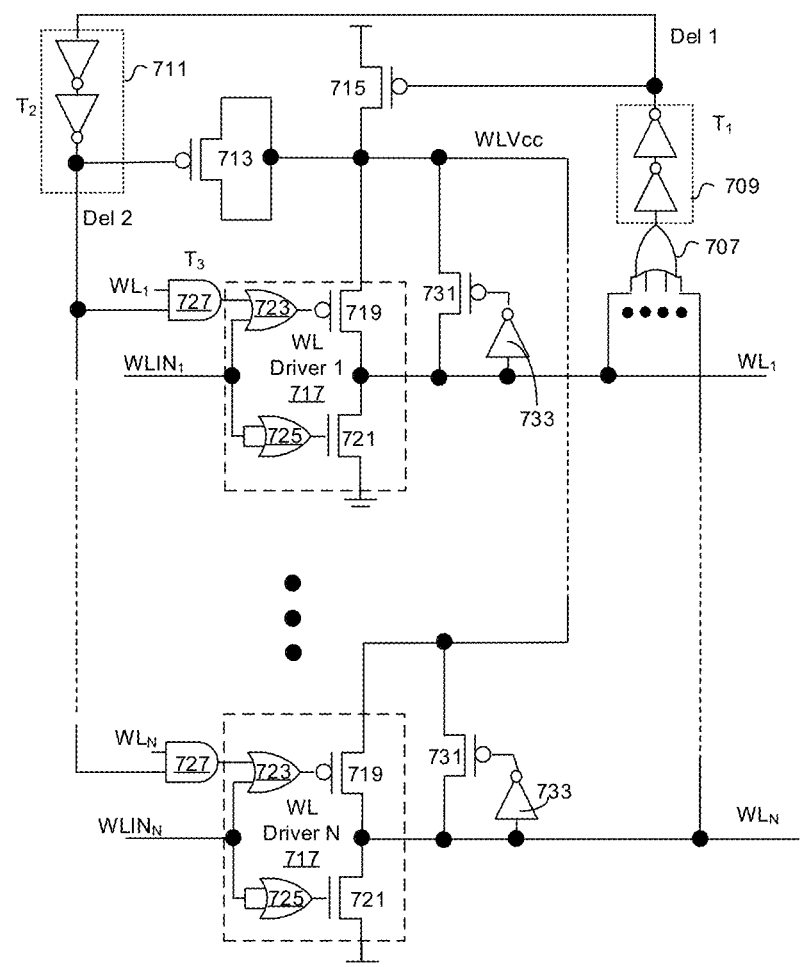
FIG. 7 is another circuit for wordline boosting combining techniques from the circuits of FIGS. 3 and 5 in accordance with some embodiments.
Figure 8:
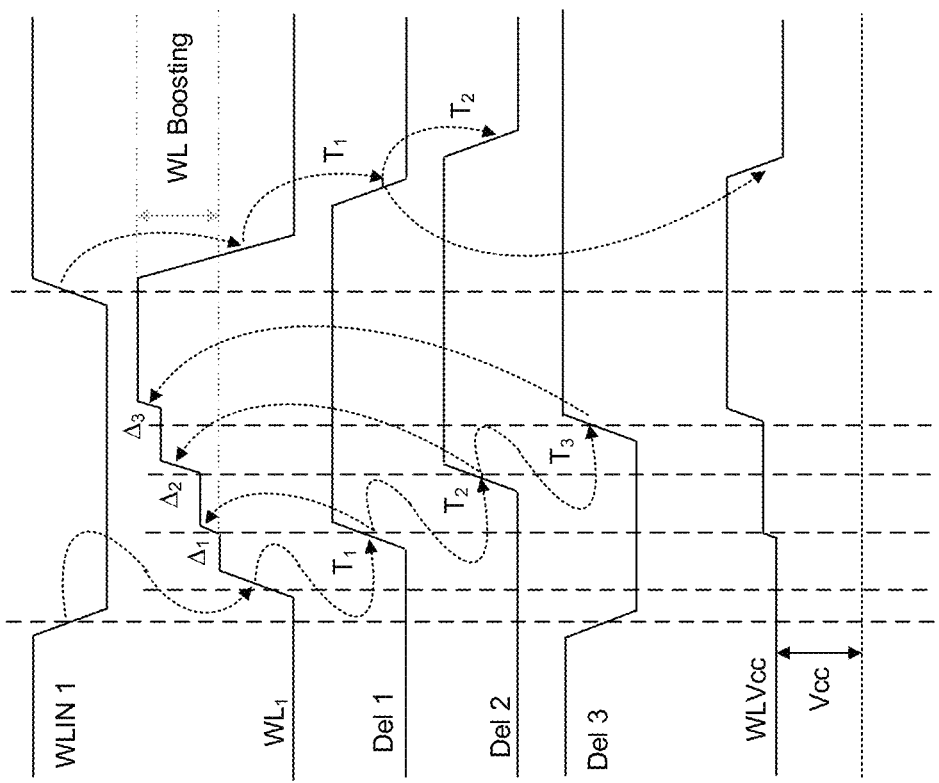
FIG. 8 is a timing diagram illustrating a wordline boosting operation for the circuit of FIG. 7.

FIG. 7 shows wordline boosting circuitry using a combination of a dedicated capacitor and wordline driver P device as flying capacitor for increased overall boosting. The components and operation may be as discussed with regard to FIGS. 3 and 5, so repeating their operation will be omitted. However, and with reference to the timing diagram of FIG. 8, the following points may be observed. The gate/drain capacitance of the header device couples after T1, resulting in a Δ1 boost. Dedicated flying capacitor (713) coupling occurs at T2 resulting in a Δ2 boost. Finally, the driver P device (719) coupling occurs at T3, resulting in a Δ3 boost. So, it can be seen that dedicated flying capacitor based boosting (Δ2) is achieved before 719 capacitively boosts (Δ3). The charge stored on the separate capacitor 713 can be shared across WLVcc and WL1 (through 719) and switch device 731. If Δ3 is achieved ahead of Δ2; it creates a slow wordline boost as charge transfer will occur primarily through switch device 731.

it should be appreciated that the flying capacitor boosting techniques described here may be used for various different memory types apart from CMOS RAM. They may be used in any array where wordline (or other applicable control line) where boosting may be helpful. Other suitable memory structures could include but are not limited to ROMs, CAMs, resistive memories such as magnetic and PCM memories and any other suitable types.

Figure 9:
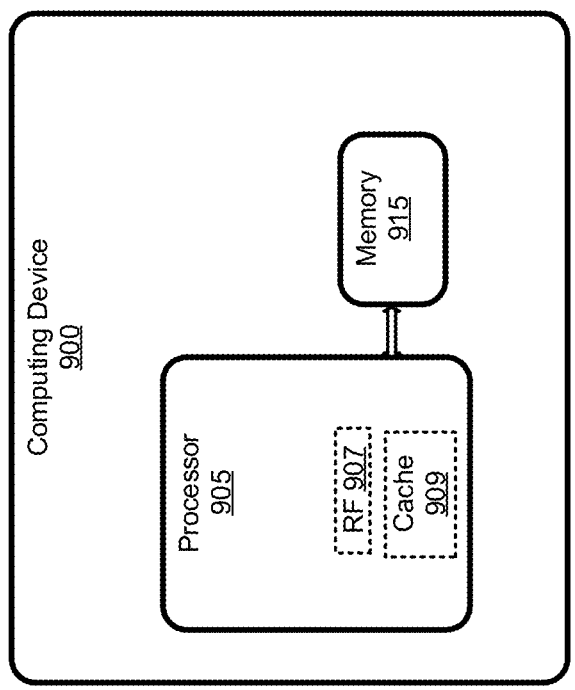
FIG. 9 is a block diagram showing a computing system having memory with wordline boosting in accordance with at least some of the embodiments disclosed herein.

FIG. 9 shows a simplified block diagram of a computing device 900 with a processor 905 and memory 915, which is external to the processor, to illustrate a possible context for embodiments of at least some of the self-timed capacitive wordline boosting techniques disclosed herein. Processor 905 can include a general-purpose processor or an application-specific integrated circuit (ASIC). It can be part of (e.g., included in) the computing device 900, which could include a computer (e.g., desktop, notebook, or server), a tablet, a cellular telephone, and other electronic devices or systems.

The processor includes register files 907 and cache memory 909, which separately or together may include memory structures with wordline boosting as disclosed herein. Similarly, memory 915, which can correspond to volatile (e.g., DRAM) and/or non-volatile (e.g., ROM, Flash, MRAM, PCM, etc.) memory can include wordline boosting circuits as taught herein as well. (One skilled in the art would recognize that a processor (e.g., a central processing unit (CPU)) such as processor 905 includes many additional components, several of which are not shown in FIG. 1 so as not to obscure the embodiments described herein.)

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A circuit, comprising: a wordline; a driver to drive a voltage onto the wordline; a supply device connected to the driver, wherein the supply device is to supply power to the driver; a boost circuit having a flying capacitor to capacitively boost the voltage driven onto the wordline, the boost circuit including a delay element coupled between the wordline and the supply device to turn Off the supply device after a first delay in response to the voltage being driven onto the wordline; and a switch to connect the drain and source of a transistor of the driver together in response to the voltage being driven onto the wordline; wherein the driver is a split driver having a pull-up device and a pull-down device that are separately controllable from one another, the flying capacitor being implemented with the pull-up device.

2. The circuit of claim 1, in which the flying capacitor is implemented with a capacitor that is separate from the driver.

3. The circuit of claim 2, in which the flying capacitor is formed from a MOS transistor with its source and drain connected to each other.

4. The circuit of claim 1, in which the pull-up device comprises the transistor which is a P-type CMOS transistor with a gate, the drain, and the source.

5. The circuit of claim 1, in which the supply device and the boost circuit are coupled to multiple additional wordlines.

6. The circuit of claim 1, in which the boost circuit includes a second delay element coupled between the delay element and the flying capacitor to trigger the flying capacitor to boost the wordline voltage in response to a transition from the delay element propagating through the second delay element.

7. The circuit of claim 1, in which the wordline is part of a cache memory array in a processor.

8. A processor, comprising: a memory array with at least one group of wordlines to access memory cells in the memory array, wherein each wordline in the at least one group has an associated driver to pull a voltage of its wordline from a first voltage up to a second voltage, wherein the second voltage is provided from a supply connected to the associated driver, wherein the supply is to provide the second voltage to the associated driver; a boost circuit coupled to the group of wordlines to capacitively boost a voltage of a selected wordline above the second voltage in response to the voltage on the wordline itself being pulled up; and a switch to connect a drain and a source of a transistor of the associated driver together in response to the voltage being driven onto the selected wordline; wherein the associated driver is a split driver having a pull-up device and a pull-down device that are separately controllable from one another, the capacitive boosting at least coming from a flying capacitor implemented with the pull-up device in a selected driver after the supply is decoupled from the selected driver.

9. The processor of claim 8, in which the boost circuit includes a first delay element coupled between the wordlines at a first end and a supply switch at a second end in order to decouple the supply from a selected driver after the selected driver has pulled up the voltage of its wordline.

10. The processor of claim 9, in which the boost circuit comprises an OR logic to couple the wordlines to the first end of the first delay element.

11. The processor of claim 10, in which the supply switch is a P-type transistor to provide the supply to the drivers in the group.

12. The processor of claim 8, in which the capacitive boosting is implemented at least through a flying capacitor that is separate from the drivers.

13. The processor of claim 12, in which the flying capacitor is formed from a MOS transistor with its source and drain connected to each other.

14. The processor of claim 8, in which the capacitive boosting is to come from both a split driver pull-up capacitance and a capacitor that is separate from any driver.

15. A circuit, comprising: a wordline in a memory array; a driver coupled to the wordline and to a supply transistor, wherein the driver is connected to the supply transistor at a supply node, wherein the supply transistor is to provide the driver with a supply, wherein the driver is to pull up a voltage on the wordline up to a voltage of the supply when the driver is asserted; wherein the driver is a split driver having a pull-up device and a pull-down device that are separately controllable from one another; a flying capacitor having first and second terminals, wherein the first terminal is coupled to the supply node; a delay circuit coupled to the wordline, the supply transistor, and the second terminal of the flying capacitor, wherein an output of the delay circuit is to decouple the supply from the supply node and to boost a voltage at the second terminal to transfer charge from the capacitor into the supply node to raise the voltage on the wordline above the voltage of the supply; and a switch to connect a drain and a source of the pull-up device of the driver together in response to the voltage being driven onto the wordline.

16. The circuit of claim 15, in which the delay circuit comprises first and second delay elements coupled together at a gate of the supply transistor.

17. The circuit of claim 15, in which the delay circuit is to turn off the supply transistor and then is to raise a voltage on the second terminal in response to the voltage on the wordline being pulled up to a logic gate input threshold level.

* * * * *